United States Patent
Jarvis et al.

(10) Patent No.: US 7,224,167 B2
(45) Date of Patent: May 29, 2007

(54) MAGNETIC FIELD GENERATING APPARATUS AND METHOD FOR MAGNETIC RESONANCE IMAGING

(75) Inventors: Peter Jarvis, Florence, SC (US); Yuri Lvovsky, Florence, SC (US)

(73) Assignee: General Electric Company, Schenectady, NY (US)

( * ) Notice: Subject to any disclaimer, the term of this patent is extended or adjusted under 35 U.S.C. 154(b) by 92 days.

(21) Appl. No.: 10/999,335

(22) Filed: Nov. 30, 2004

(65) Prior Publication Data
US 2006/0113995 A1  Jun. 1, 2006

(51) Int. Cl.
*G01V 3/00* (2006.01)
(52) U.S. Cl. .................................... 324/318
(58) Field of Classification Search ............ 324/318, 324/320
See application file for complete search history.

(56) References Cited

U.S. PATENT DOCUMENTS

| | | | |
|---|---|---|---|
| 5,400,786 A | 3/1995 | Allis | |
| 5,481,191 A | 1/1996 | Rzedzian | |
| 5,550,472 A * | 8/1996 | Richard et al. | 324/320 |
| 5,701,112 A * | 12/1997 | Brown | 335/216 |
| 5,786,695 A * | 7/1998 | Amor et al. | 324/320 |
| 5,864,275 A * | 1/1999 | Ohashi et al. | 335/306 |
| 6,479,999 B1 * | 11/2002 | DeMeester et al. | 324/318 |
| 6,529,005 B1 | 3/2003 | Kasten et al. | |
| 6,788,060 B1 * | 9/2004 | Feenan et al. | 324/320 |
| 6,816,047 B2 * | 11/2004 | Takeshima et al. | 335/216 |
| 6,819,107 B2 * | 11/2004 | Heid | 324/318 |
| 6,825,663 B2 | 11/2004 | Bechtold et al. | |
| 6,853,855 B2 * | 2/2005 | Ideler | 600/410 |
| 2003/0160613 A1 | 8/2003 | Bechtold et al. | 324/315 |
| 2005/0077899 A1 * | 4/2005 | Jacobs | 324/320 |

FOREIGN PATENT DOCUMENTS

| | | |
|---|---|---|
| EP | 0 715 181 B1 | 4/2002 |
| GB | 2 354 328 | 3/2001 |
| GB | 2 382 144 A | 5/2003 |
| GB | 2 385 949 A | 9/2003 |

OTHER PUBLICATIONS

Japanese Abstract 2000-342554 A, Dec. 12, 2000.

* cited by examiner

*Primary Examiner*—Brij Shrivastav
*Assistant Examiner*—Megann E. Vaughn
(74) *Attorney, Agent, or Firm*—Cantor Colburn LLP

(57) ABSTRACT

A magnetic field generating apparatus for use in magnetic resonance imaging (MRI) is disclosed. The apparatus includes an annular magnet field generator defining a patient bore, a gradient coil disposed between the magnetic field generator and the patient bore, a first set of shim elements, and a second set of shim elements. The patient bore has an imaging volume, a z-axis, and an isocenter. The first set of shim elements are disposed at a region between the magnetic field generator and the imaging volume, and the second set of shim elements are disposed at the region at a location having equal to or greater than a specified Z/R ratio, where Z defines an axial distance from the isocenter and R defines a radial distance from the z-axis.

20 Claims, 4 Drawing Sheets

Harmonics produced by pair of magnetized rings with cross-section of 10mm$^2$ and with $B_{sat}$ =0.3T

MAGNETIC FIELD GENERATING APPARATUS AND METHOD FOR MAGNETIC RESONANCE IMAGING

BACKGROUND OF THE INVENTION

The present disclosure relates generally to a magnetic field generating apparatus for magnetic resonance imaging, and particularly to a magnetic field generating apparatus with compensation of the variation of the central field.

Magnetic resonance imaging (MRI) for medical diagnostics or otherwise requires a magnetic field generating apparatus capable of producing a high degree of final homogeneity in the magnetic field generated in the imaging volume. To accomplish this high degree of homogeneity, shimming systems are used, which often include passive shimming elements. Steel shim elements placed inside the patient bore and saturated by the main field provide a desirable degree of compensation to offset manufacturing and environmental inhomogeneities inherent in the MRI system. The total amount and location of the shimming steel varies from magnet to magnet, where large amounts of steel may be required in magnets with high original inhomogeneity, or in magnets situated in a strong magnetic environment.

With shimming steel, saturation magnetization of the shim elements decreases with temperature, that is, $dB_{sat}/dT<0$, thereby resulting in a compensation system that is temperature sensitive. Shim elements positioned between the gradient coils and the bore of the magnet vacuum vessel are subject to heating coming from the gradient coils during scanning. Most of the shim elements in the MRI system produce a negative contribution to the central field B0, where B0 is Bz at z=0, that decreases with temperature, such that as the temperature rises, the central field B0 in the magnet rises. Since imaging RF frequency is directly proportional to the central field B0, a stable central field B0 is important for generating a high image quality from the MRI system. The temperature sensitivity of the B0 shimming system imposes limitations on the allowable amount of shimming steel that may be used, thereby effecting the overall shimming capacity.

Acquiring an ability to compensate for B0 temperature sensitivity of the shimming system would release the above restrictions, allow an increase in shimming capacity, and enable different design solutions in an MRI scanner system. Accordingly, there is a need in the art for an improved MRI shimming system.

BRIEF DESCRIPTION OF THE INVENTION

Embodiments of the invention include a magnetic field generating apparatus for use in magnetic resonance imaging (MRI). The apparatus includes an annular magnet field generator defining a patient bore, a gradient coil disposed between the magnetic field generator and the patient bore, a first set of shim elements, and a second set of shim elements. The patient bore has an imaging volume, a z-axis, and an isocenter. The first set of shim elements are disposed at a region between the magnetic field generator and the imaging volume, and the second set of shim elements are disposed at the region at a location having equal to or greater than a specified Z/R ratio, where Z defines an axial distance from the isocenter and R defines a radial distance from the z-axis.

Other embodiments of the invention include a magnetic field generating apparatus for use in magnetic resonance imaging (MRI). The apparatus includes an annular magnet field generator defining a patient bore, a gradient coil disposed between the magnetic field generator and the patient bore, a first set of shim elements, a second set of shim elements, a first heater, and a second heater. The patient bore has an imaging volume, a z-axis, and an isocenter. The first set of shim elements are disposed at a first region between the magnetic field generator and the imaging volume. The second set of shim elements have a first portion disposed at a second region and a second portion disposed at a third region between the magnetic field generator and the imaging volume, at a location having a specified Z/R ratio greater than about 0.707, where Z defines an axial distance from the isocenter and R defines a radial distance from the z-axis. The first heater is disposed at the second region, and the second heater is disposed at the third region. The first and second heaters regulate the temperature of the first and second portions of the second set of shim elements substantially independent from the first set of shim elements.

Further embodiments of the invention include a method for compensating for the B0 field variations in a magnetic field generating apparatus for use in MRI, the B0 field variations arising from a temperature change at a first set of shimming elements configured and disposed to compensate for manufacturing and environmental B0 field inhomogeneities inherent in a magnetic field generator of the apparatus. The, method includes disposing a second set of shimming elements between the magnetic field generator and an imaging volume of the apparatus at a location having a Z/R ratio greater than about 0.707.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the invention provides a magnetic field generating apparatus for use in magnetic resonance imaging (MRI) having two sets of magnetic field adjusting shim elements. A first set of shim elements are configured to compensate for the inhomogeneities resulting from the main field generator, and a second set of shim elements are configured to compensate for the inhomogeneities resulting from a temperature change in the first set of shim elements. While embodiments described herein depict two sets of shim elements, it will be appreciated that the disclosed invention is not so limited and may also be applicable to multiple sets of shim elements, particularly with respect to the second set of shim elements.

Figure 1:
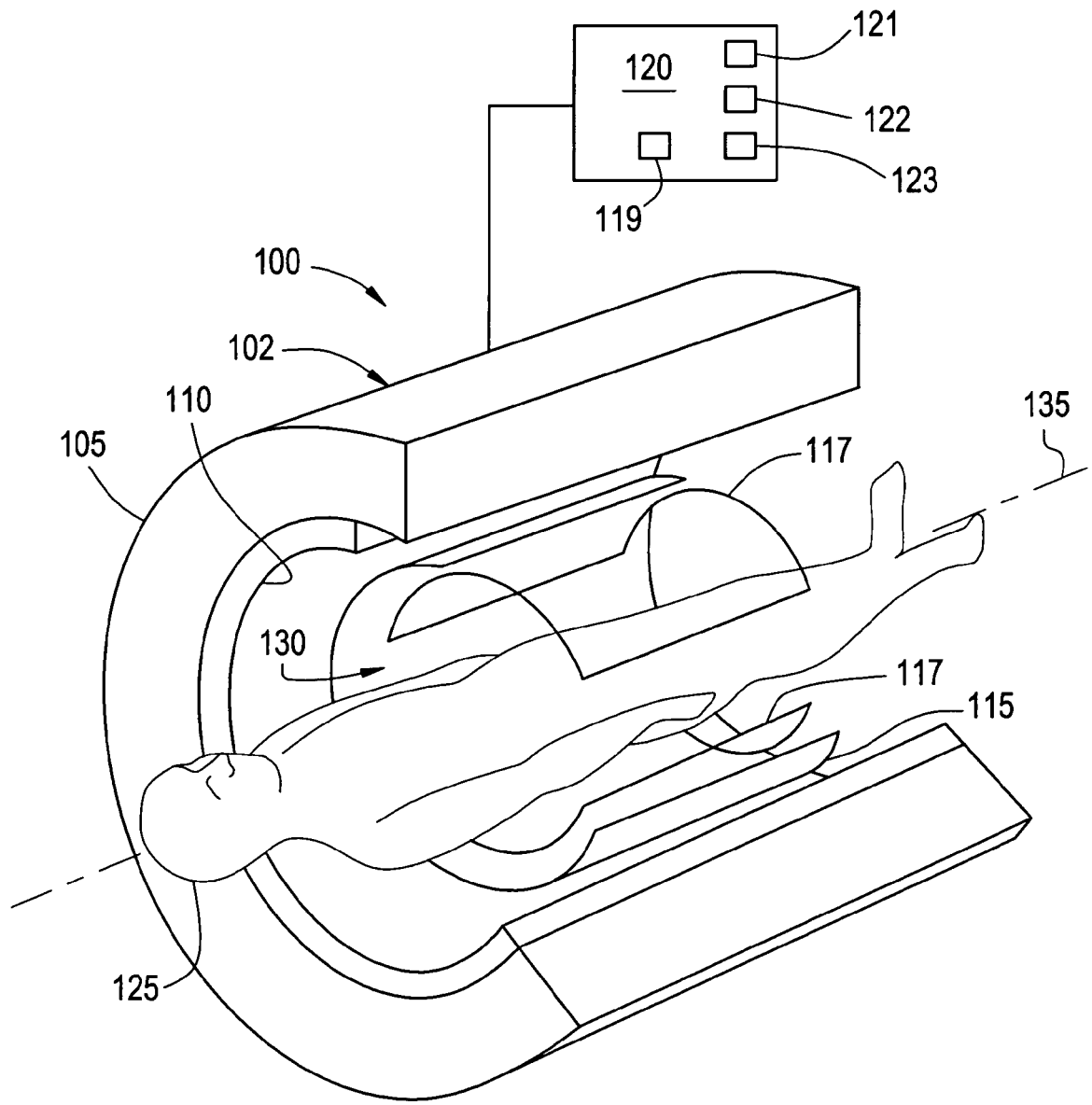
FIG. 1 depicts an exemplary MRI system for use in accordance with embodiments of the invention.

FIG. 1 depicts an exemplary embodiment of an MRI system 100 having a magnetic field generating apparatus 102 and a control system 120 for the control and operation thereof. An exemplary apparatus 102, shown having a portion cutaway to show structure within apparatus 102, includes an annular magnetic field generator 105, X-Y-Z gradient coils 110 disposed within field generator 105 for spatial encoding of the magnetic field within an imaging volume inside a patient bore 130, an RF body coil 117 for generating a pulsed RF magnetic $B_1$ field, and an optional RF shield 115 disposed between RF coil 117 and gradient coil 110 for providing RF shielding. A person 125 or other imaging object is placed within bore 130 of field generating apparatus 102 and subjected to MRI diagnostics under the control of control system 120. In an embodiment, control system 120 includes x, y and z-axis gradient magnetic field power supplies 121 for powering gradient coil 110, an RF coil amplifier 119, transmit and receive circuitry 122 for controlling the RF pulses to RF coils 117, and a computer system 123 for overall control and for processing and displaying the nuclear magnetic resonance signals.

Figure 2:
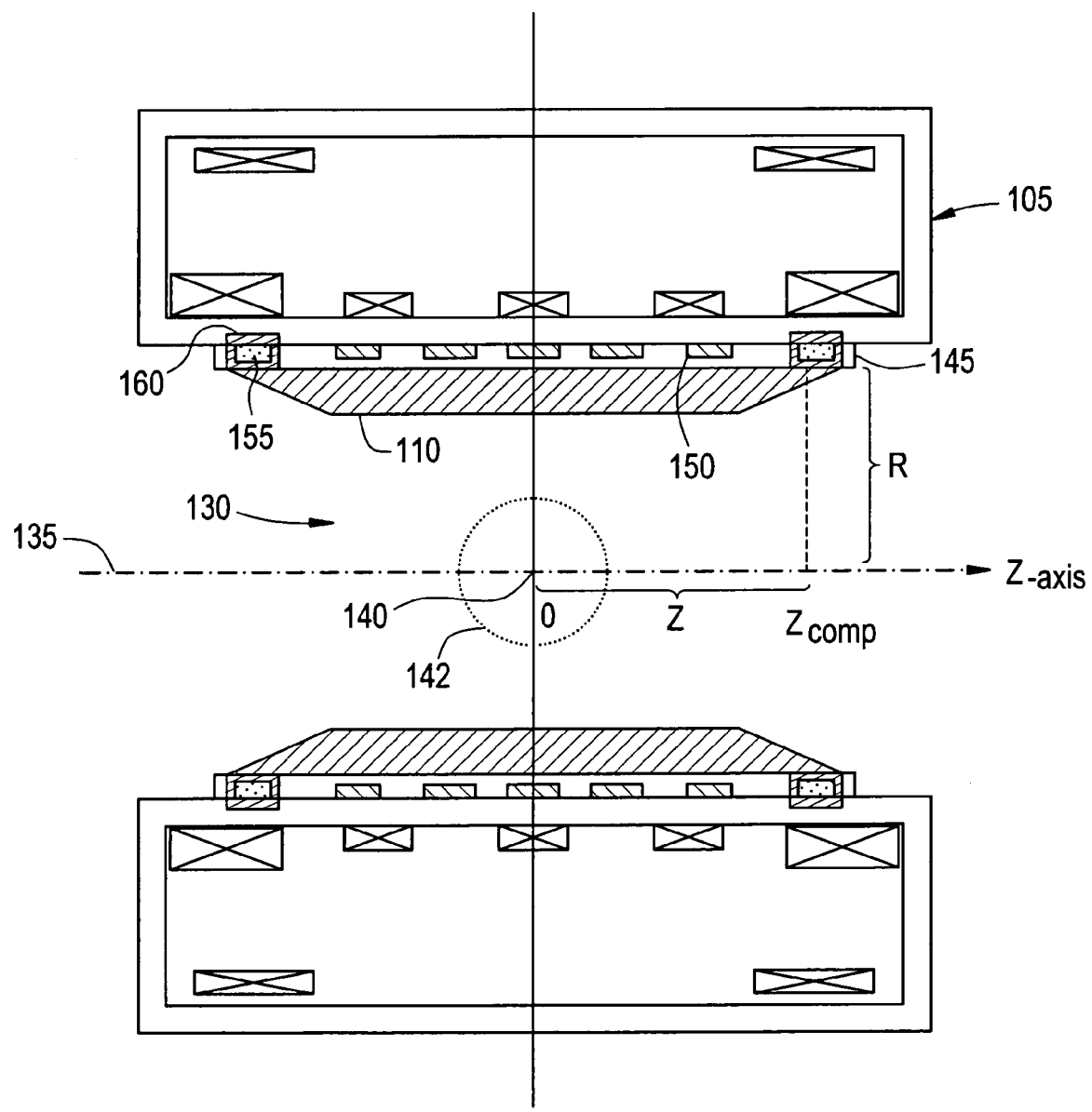
FIG. 2 depicts a partial section view of an exemplary magnetic field generating apparatus in accordance with embodiments of the invention.

Reference is now made to FIG. 2, which depicts a partial section view of apparatus 102 with the section plane containing z-axis 135. Annular magnetic field generator (field generator) 105 defines the patient bore 130 with z-axis 135, an isocenter 140, and a field-of-view (FOV) (alternatively referred to as an imaging volume) 142 about isocenter 140 and illustrated by a dotted circle. Gradient coils 110 and RF coil 117 (depicted in FIG. 1 but not shown in FIG. 2) are disposed between field generator 105 and FOV 142. In an embodiment, and disposed at a region 145 between the field generator 105 and the gradient coil 110 is a first set of shim elements 150 (depicted as shaded rectangles) and a second set of shim elements 155 (depicted as speckled rectangles). The second set of shim elements 155 may be configured as continuous or non-continuous rings or arcs about patient bore 130. With reference to isocenter 140, the first and second sets of shim elements 150, 155 are each disposed at locations defined by a Z/R ratio, that is, at locations having an axial distance Z from isocenter 140 divided by a radial distance R from z-axis 135. Each of the shim elements 150 of the first set may be disposed at locations anywhere within region 145. However, each of the shim elements 155 of the second set are disposed at a location having equal to or greater than a specified Z/R ratio. In accordance with an embodiment of the invention, the specified Z/R ratio is greater than 0.707. In accordance with another embodiment of the invention, the specified Z/R ratio is equal to or greater than 1.7.

As depicted in FIG. 2, the second set of shim elements are arranged in pairs centered about isocenter 140, with a first portion of the pair being disposed at a location defined by a $+Z_{comp}/R$ ratio and a second portion being disposed at a location defined by a $-Z_{comp}/R$ ratio, where the term $Z_{comp}$ denotes a location along the z-axis 135 where the compensating shim elements 155 are located. The first set of shim elements 150 are configured and disposed to substantially compensate for the field inhomogeneities resulting from field generator 105, while the second set of shim elements 155 are configured and disposed to substantially compensate for the B0 field variations resulting from a temperature change in the first set of shim elements 150, which will be discussed in more detail below. Furthermore, the second set of shim elements 155 are configured and disposed to have substantially no compensating effect with respect to the field inhomogeneities resulting from field generator 105. In this manner, magnet-induced instability resulting from inhomogeneities from field generator 105 may be compensated for independently of temperature-induced instability resulting from inhomogeneities from a temperature change in shim elements 150, thereby enabling higher final field homogeneity in the MRI apparatus 102 for greater image quality, or lower system cost with no loss of image quality.

Figure 3:
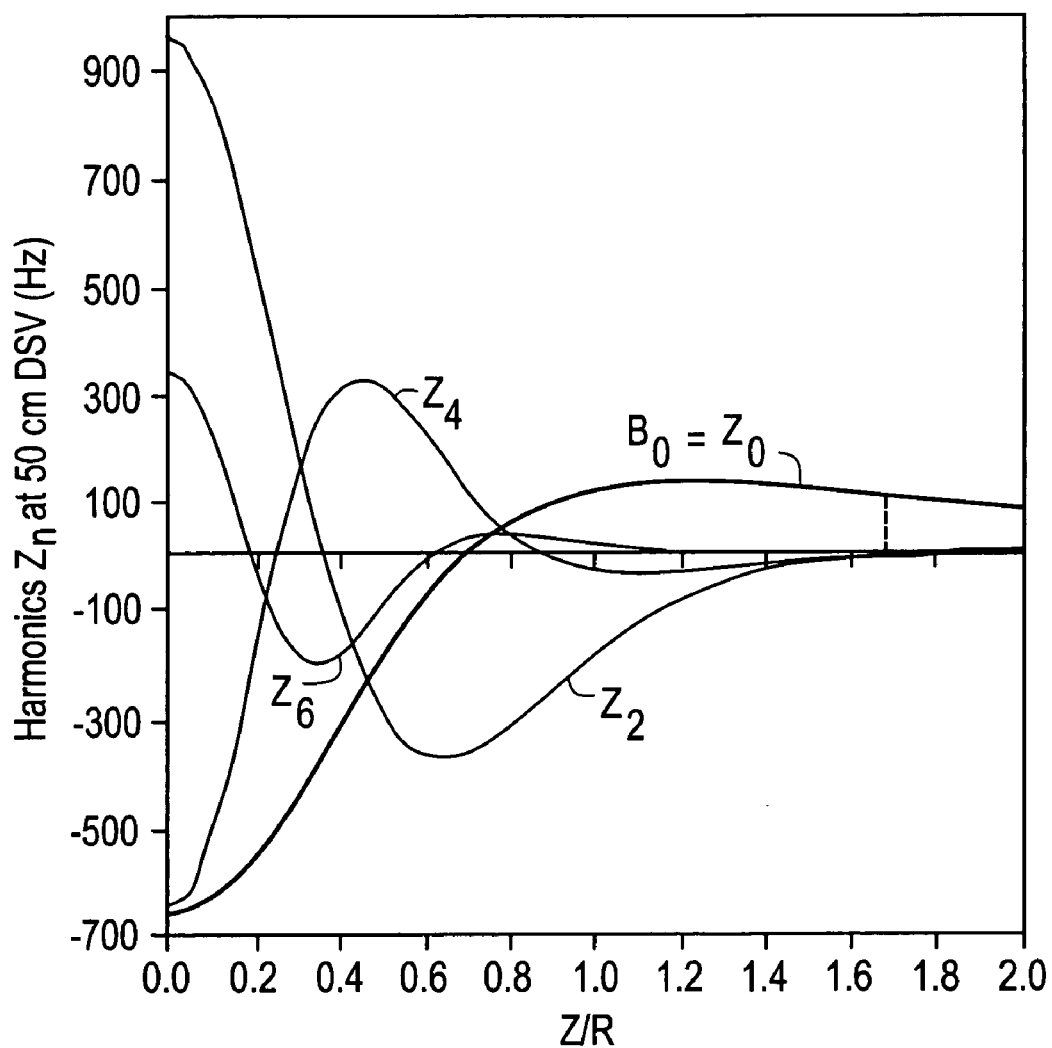
FIG. 3 illustrates magnetization characteristics in accordance with an embodiment of the invention.

As mentioned previously, the saturation magnetization of shim elements 150 tend to decrease with temperature, $dB_{sat}/dT<0$, thereby resulting in a decrease in magnetization contribution from shim elements 150 as the temperature in region 145 increases. Viewed another way, as the temperature in region 145 increases, the first set of shim elements 150 tend to produce less of a negative contribution to the central field B0, where B0 is Bz at z=0, such that a rise in temperature of shim elements 150 results in a rise in the central field from the magnet (field generator) 105. In accordance with embodiments of the invention, strategic placement of compensating shims (second set of shim elements) 155 will provide a counterbalancing contribution $dB0_{comp}$ to the central field. Referring now to FIG. 3, the B0 field and axial magnetization harmonics $Z_2$, $Z_4$, and $Z_6$, within apparatus 102 are illustrated as a function of the Z/R ratio. In the illustration of FIG. 3, the B0 field and harmonics were produced using a pair of shim element rings 155 operating at a temperature of about 20° C. (degree-Celsius) with a cross section area of about 10 square millimeters ($mm^2$) and a B-field saturation of about 0.3 tesla (T). As can be seen, the magnetization contribution to each harmonic is seen to change sign and decay as the Z/R ratio increases, with the B0 field contribution being dominant for larger Z/R values, for example at a Z/R ratio of about 1.7. At a Z/R ratio of about 0.707, FIG. 3 illustrates the B0 field contribution changing sign from a negative to a positive one.

FIG. 3 illustrates the B0 field compensation achievable by using compensating shim elements (second set of shim elements) 155. Since the B0 field contribution changes sign at Z/R equal to about 0.707, so compensation elements positioned farther away will always produce a positive B0 contribution, which is opposite in sign to the negative B0 field contribution coming from shims, such as the first set of shim elements 150. Accordingly, placing the second set of shim elements 155 at a Z/R ratio greater than 0.707 will always provide a positive B0 field contribution to offset the negative B0 field contribution from the first set of shim elements 150 located at a Z/R ratio of less than 0.707. Furthermore, by placing the second set of shim elements 155 at a Z/R ratio of equal to or greater than 1.7, the effect of axial harmonics $Z_2$, $Z_4$ and $Z_6$, from the second set of shim elements 155 themselves will be minimized, , resulting in a reduced varying contribution to inhomogeneity arising from the second set of shim elements 155.

In an embodiment, shim elements 150 and 155 may be made of a material having the same magnetization temperature sensitivity, such as for example a magnetic material having a $dB_{sat}/dT<0$ on the order of about –0.01%/° C., or on the order of about –0.2 mT/° C. (millitesla-per-degree-Celsius). Alternatively, shim elements 155 may be made of a material with low Curie temperature and having a greater magnetization temperature sensitivity than that of shim elements 150, such as nickel-iron alloy with approximately 30% nickel, for example, Thermoflux® alloys (available from Vacuumschmelze) having a $dB_{sat}/dT<0$ on the order of up to –2%/° C., or on the order of up to –6.5 mT/° C. Where shim elements 155 are made from Thermoflux® alloy, the shims lose their magnetization as their temperature rises from 20° C. to about 50–80° C. By using shim elements 155 having a higher magnetization temperature sensitivity than shim elements 150, that is, $|dB_{sat}(shim\ 155)/dT| >> |dB_{sat}$ (shim 150)/dT|, more effective B0 field compensation may be achieved, and/or smaller compensating elements may be used for shim elements 155.

To provide for an adjustable B0 field compensation, field generator 105 may include a ring housing 160 adapted to house the second set of shim elements 155, thereby enabling the degree of B0 field compensation resulting from the second set of shim elements 155 to be adjustable by using different amounts of magnetic materials for shim elements 155.

Figure 4:
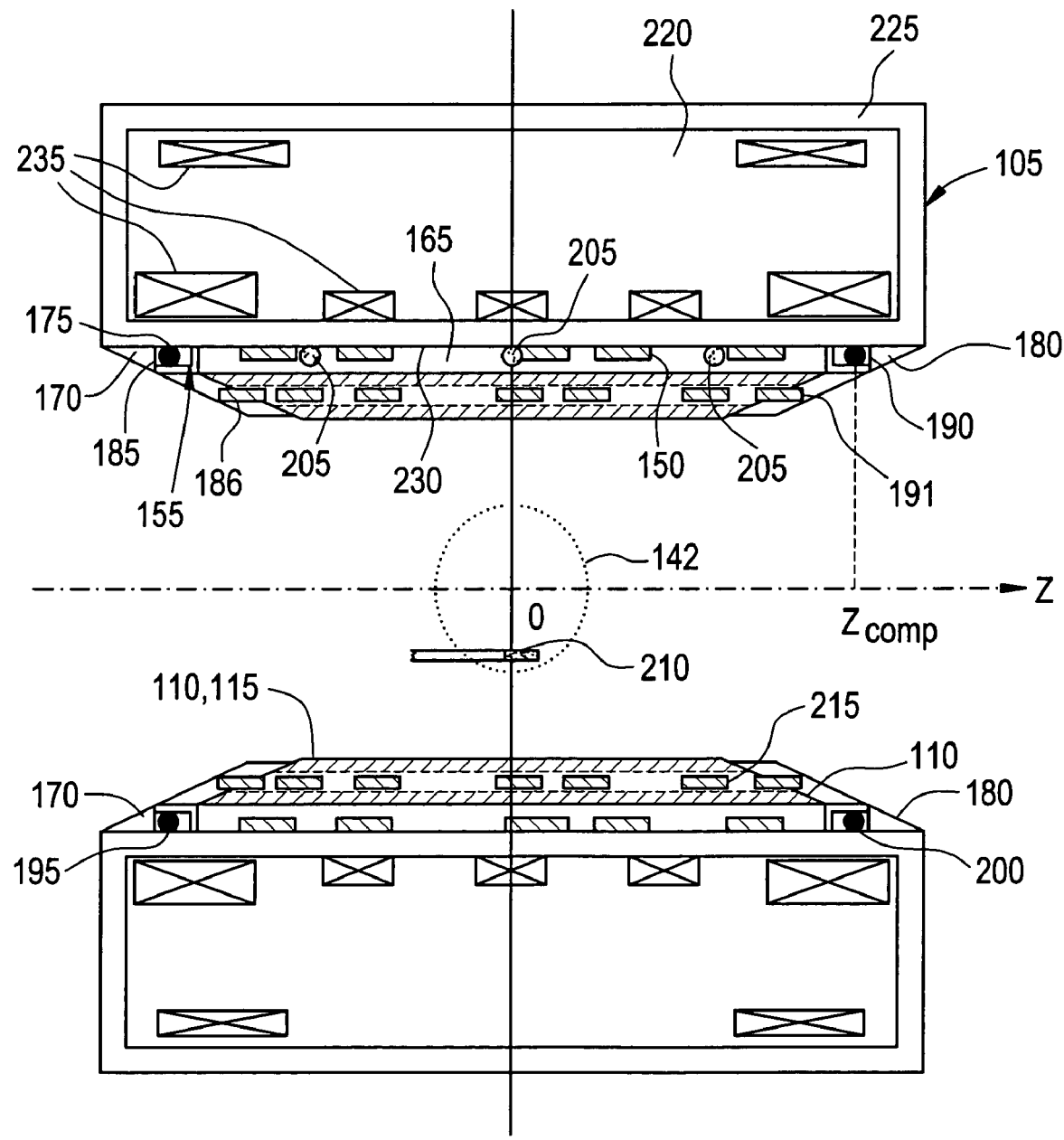
FIG. 4 depicts an alternative embodiment to the apparatus depicted in FIG. 2.

In an alternative embodiment, and with reference now to FIG. 4, region 145 may be divided into a first region 165 and a second region 170, where the first set of shim elements 150 are disposed at the first 165, and the second set of shim elements 155 are disposed at the second region 170. Here, however, second region 170 also includes a heater 175, which is used to regulate the temperature of at least a portion of the second set of shim elements 155 substantially independent from the first set of shim elements 150.

More specifically describing the configuration illustrated in FIG. 4, region 145 may be divided into a first region 165, a second region 170, and a third region 180. The second set of shim elements 155 may include a first portion 185 disposed at the second region 170 and a second portion 190 disposed at the third region 180. And, heater 175 may include a first heater 195 disposed at the second region 170 and a second heater 200 disposed at the third region 180. Here, the first 195 and second 200 heaters regulate the first 185 and second 190 portions, respectively, of the second set of shim elements 155 substantially independent from the first set of shim elements 150.

To assist with the temperature regulation of the second set of shim elements 155, temperature sensors 205 may be disposed at the first region 165 so as to provide a signal representative of the temperature of at least a portion of the first set of shim elements 150 to control system 120. In response thereto, control system 120 controls heaters 195, 200 at regions 170, 180. In this manner, the temperature of the second set of shim elements 155 may be adjusted to provide the appropriate change in B0 field compensation to compensate for variations arising from a change in temperature at the first set of shim elements 150.

The use of heaters 195, 200 may enable a higher temperature change at the second set of shims 155 as compared to the temperature change experienced by the first set of shims 150, thereby enabling a large range of dB0 compensation to be achieved with smaller compensating elements for the second set of shims 155.

In an alternative embodiment, a magnetic field sensor, for example an NMR probe, 210 may be disposed at the patient bore 130 so as to provide a signal representative of the magnetic field in the imaging volume within patient bore 130. In this manner, a signal from sensor 210 is received at control system 120, which in turn controls the operation of heaters 195, 200 at regions 170, 180 for controlling the degree of B0 field compensation to adjust for dynamic B0 field inhomogeneities observed at patient bore 130. By using magnetization sensor 210 in a feedback loop, B0 field compensation may be controlled by B0 field tracking rather than temperature sensing at shims 150, thereby providing a more direct B0 field compensation.

Alternatively, as depicted in FIG. 4, the first set of shim elements 150 may be located inside the gradient coil 110, as depicted by reference numeral 215, and compensating elements 155 may or may not be located within the gradient coil 110, as depicted by reference numerals 185, 190 and 186, 191. While embodiments of the invention disclose a field generator 105 having a superconducting magnet 220, an outer vacuum vessel (cryostat) 225, a cryostat inner cylinder 230, and field generator windings 235, in addition to other components previously discussed, the invention is not intended to be limited to only the field generator 105 disclosed, but is also intended to encompass field generators having more or less components, as well as different components, than those disclosed herein.

In view of the foregoing described structure, a method for compensating for the B0 field variations in the magnetic field generating apparatus 102 for use in MRI, the B0 field variations arising from a temperature change at the first set of shimming elements 150 configured and disposed to compensate for manufacturing and environmental B0 field inhomogeneities inherent in a magnetic field generator 105 of the apparatus 102, may be accomplished by disposing a second set of shimming elements 155 between the magnetic field generator 105 and the gradient coil 110 of the apparatus 102, or radially within the gradient coil 110, at a location having a Z/R ratio that is greater than about 0.707. In another embodiment, the compensating method may be accomplished by disposing the second set of shimming elements 155 between the magnetic field generator 105 and a gradient coil 110 of the apparatus 102, or radially within the gradient coil 110, at a location having a Z/R ratio that is equal to or greater than about 1.7.

As disclosed, some embodiments of the invention may include some of the following advantages: the ability to remove restrictions on B0 temperature sensitivity coming from the passive shim elements 150 and other sources; the ability to realize higher shimming capacity, thereby reducing the number of rejected magnets and/or the cost of their rework; higher image quality of the MRI scanner by effectively controlling B0 temperature-induced instability from magnetization inhomogeneities; and, the reduction or elimination of superconducting shim coils without compromising image quality, thereby reducing overall system cost.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A magnetic field generating apparatus for use in magnetic resonance imaging (MRI), the apparatus comprising:
an annular magnet field generator defining a patient bore having an imaging volume, a z-axis, and an isocenter;
a gradient coil disposed between the magnetic field generator and the patient bore;
a first set of shim elements disposed at a region between the magnetic field generator and the imaging volume; and
a second set of shim elements disposed at the region at a location having equal to or greater than a specified Z/R ratio, where Z defines an axial distance from the isocenter and R defines a radial distance from the z-axis;

wherein the first set of shim elements are configured and disposed to substantially compensate for field inhomogeneities resulting from the magnetic field generator;

wherein the second set of shim elements are configured and disposed to substantially compensate for B0 field variations resulting from a temperature change in the first set of shim elements; and wherein in response to the first set of shim elements being disposed at a location having less than the specified Z/R ratio a negative B0 field contribution results, and in response to the second set of shim elements being disposed at a location having equal to or greater than the specified Z/R ratio a positive B0 field contribution results to offset the negative B0 field contribution from the first set of shim elements.

2. The apparatus of claim 1, wherein:
the specified Z/R ratio is greater than about 0.707.

3. The apparatus of claim 2, wherein: the specified Z/R ratio is equal to or greater than about 1.7.

4. The apparatus of claim 1, wherein:
the second set of shim elements are arranged in pairs centered about the isocenter.

5. The apparatus of claim 1, wherein:
the second set of shim elements are configured and disposed to have substantially no compensating effect with respect to the B0 field inhomogeneities resulting from the magnetic field generator.

6. The apparatus of claim 1, wherein:
the first set of shim elements comprise a first material having a first magnetization temperature sensitivity;
the second set of shim elements comprise a second material having a second magnetization temperature sensitivity; and
the second magnetization temperature sensitivity is greater than the first magnetization temperature sensitivity.

7. The apparatus of claim 1, wherein:
the B0 field contribution from the second set of shim elements is equal to, and opposite in sign to, the B0 field contribution from the first set of shim elements.

8. The apparatus of claim 1, further comprising:
a housing adapted to house the second set of shim elements;
wherein the degree of B0 field compensation resulting from the second set of shim elements is adjustable by use of different magnetic elements for the second set of shim elements.

9. The apparatus of claim 1, wherein the region comprises a first region and a second region, the first set of shim elements being disposed at the first region, the second set of shim elements being disposed at the second region, and further comprising:
a heater disposed at the second region;
wherein the heater regulates the temperature of at least a portion of the second set of shim elements substantially independent from the first set of shim elements.

10. The apparatus of claim 9, wherein:
the region further comprises a third region;
the second set of shim elements comprises a first portion disposed at the second region and a second portion disposed at the third region; and further comprising:
a first heater disposed at the second region; and
a second heater disposed at the third region;

wherein the first and second heaters regulate the first and second portions, respectively, of the second set of shim elements substantially independent from the first set of shim elements.

11. The apparatus of claim 9, further comprising:
a temperature sensor disposed at the first region so as to provide a signal representative of the temperature of at least a portion of the first set of shim elements;
wherein the heater at the second region is responsive to the signal from the temperature sensor.

12. The apparatus of claim 9, further comprising:
a magnetic field sensor disposed at the patient bore so as to provide a signal representative of a magnetic field within the patient bore;
wherein the heater at the second region is responsive to the signal from the magnetic field sensor.

13. The apparatus of claim 1, wherein:
the second set of shim elements are continuous rings about the patient bore.

14. The apparatus of claim 1, wherein:
the second set of shim elements are non-continuous arcs about the patient bore.

15. The apparatus of claim 1, wherein:
the first set of shim elements are disposed at a second region between the gradient coil and the imaging volume.

16. The apparatus of claim 15, wherein:
the second set of shim elements are disposed at the second region at a location having a Z/R ratio greater than about 0.707.

17. A magnetic field generating apparatus for use in magnetic resonance imaging (MRI), the apparatus comprising:
an annular magnet field generator defining a patient bore having an imaging volume, a z-axis, and an isocenter;
a gradient coil disposed between the magnetic field generator and the patient bore;
a first set of shim elements disposed at a first region between the magnetic field generator and the imaging volume; and
a second set of shim elements having a first portion disposed at a second region and a second portion disposed at a third region between the magnetic field generator and the imaging volume, at a location having a specified Z/R ratio, where Z defines an axial distance from the isocenter and R defines a radial distance from the z-axis;
a first heater disposed at the second region; and
a second heater disposed at the third region;
wherein the specified Z/R ratio is greater than about 0.707; and
wherein the first and second heaters regulate the temperature of the first and second portions of the second set of shim elements substantially independent from the first set of shim elements.

18. The apparatus of claim 17, wherein:
the first and second portions are disposed symmetrical about the isocenter.

19. A method for compensating for the B0 field variations in a magnetic field generating apparatus for use in MRI, the B0 field variations arising from a temperature change at a first set of shimming elements configured and disposed to compensate for manufacturing and environmental B0 field inhomogeneities inherent in a magnetic field generator of the apparatus, the method comprising:

disposing a second set of shimming elements between the magnetic field generator and an imaging volume of the apparatus at a location having a Z/R ratio greater than about 0.707.

20. The method of claim 19, further comprising:

disposing the second set of shimming elements between the magnetic field generator and the imaging volume of the apparatus at a location having a Z/R ratio that is equal to or greater than about 1.7.

* * * * *